(12) United States Patent
Huang et al.

(10) Patent No.: US 6,779,981 B2
(45) Date of Patent: Aug. 24, 2004

(54) FAN CONTROL SYSTEM USING A MICROCONTROLLER

(75) Inventors: Wen-Shi Huang, Chungli (TW); Kuo-Cheng Lin, Taoyuan (TW); Hsu Kuo Sung, Chungli (TW); Shou Te Yu, Taoyuan (TW)

(73) Assignee: Delta Electronics, Inc., Taoyuan Sien (TW)

( * ) Notice: Subject to any disclaimer, the term of this patent is extended or adjusted under 35 U.S.C. 154(b) by 33 days.

(21) Appl. No.: 10/193,790

(22) Filed: Jul. 12, 2002

(65) Prior Publication Data

US 2003/0091441 A1 May 15, 2003

(30) Foreign Application Priority Data

Nov. 14, 2001 (TW) ........................................ 90128219 A (51) Int. Cl.[7] ................................................. F04B 49/00
(52) U.S. Cl. .......................... 417/42; 417/22; 417/44.1; 417/45; 318/254
(58) Field of Search ........................... 417/42, 22, 44.1, 417/45; 318/254, 772; 361/687, 695

(56) References Cited

U.S. PATENT DOCUMENTS

| | | | | |
|---|---|---|---|---|
| 4,656,553 A | * | 4/1987 | Brown | 361/31 |
| 5,099,181 A | * | 3/1992 | Canon | 318/254 |
| 6,008,603 A | * | 12/1999 | Jones et al. | 318/254 |
| 6,135,718 A | * | 10/2000 | Yang | 417/22 |
| 6,328,000 B1 | * | 12/2001 | Hawkins et al. | 123/41.12 |
| 6,329,783 B1 | * | 12/2001 | Vrionis et al. | 318/772 |
| 6,392,372 B1 | * | 5/2002 | Mays, II | 318/254 |
| 6,407,672 B1 | * | 6/2002 | Grenz et al. | 340/635 |
| 6,587,337 B2 | * | 7/2003 | Sasaki | 361/687 |
| 6,592,449 B2 | * | 7/2003 | Cipolla et al. | 454/184 |

* cited by examiner

Primary Examiner—Justine R. Yu
Assistant Examiner—Michael K. Gray
(74) Attorney, Agent, or Firm—Thomas, Kayden, Horstemeyer & Risley (57) ABSTRACT

A fan control system. The fan motor is operated normally at not greater than a preset maximum rotation speed. The fan control system has a programmable microcontroller to receive an input voltage and a rotation speed signal corresponding to the actual rotation speed of the fan motor, determining an output signal according to the input voltage and the rotation speed signal, and outputting the output signal; and a fan-driving unit to receive the output signal and adjusting the rotation speed for driving the fan motor according to the output signal. When the rotation speed is lower than a predetermined rotation speed, the rotation speed is in a relation of a first function to the input voltage; when the rotation speed is greater than the predetermined rotation speed, the rotation speed is in a relation of a second function to the input voltage. The first function and the second function are separate mathematical functions, and a first maximum voltage obtained from the maximum rotation speed in the relation of the first function is lower than a second maximum voltage obtained from the maximum rotation speed in the relation of the second function.

27 Claims, 9 Drawing Sheets

FAN CONTROL SYSTEM USING A MICROCONTROLLER

BACKGROUND OF THE INVENTION

1. Field of the Invention

The present invention relates to a fan control system, and particularly to a fan control system using a microcontroller.

2. Description of the Related Art

Generally, conventional fan control systems are constructed with various electrical circuits or elements in order to achieve control. Examples of the conventional fan control system with different functions are described hereafter in detail with reference to FIG. 1a, FIG. 1b, FIG. 1c, FIG. 2a and FIG. 2b.

Figure 1A:
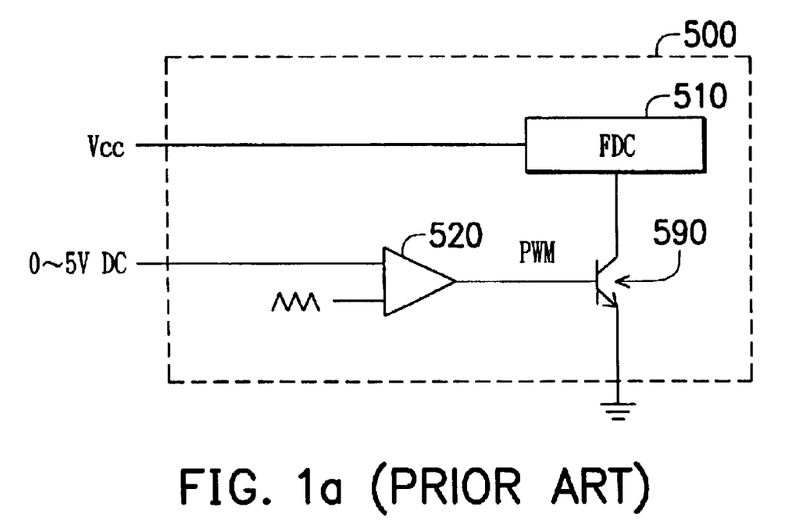
FIG. 1a is a schematic view showing a conventional fan control system controlled by an external variable DC voltage.

A general function of the conventional fan control system is the fan rotation speed control. FIG. 1a shows an example of the conventional fan control system, in which an external variable DC voltage is applied for fan rotation speed control. In FIG. 1a, the fan 500 receives an operating voltage Vcc, and determines a pulse width modulation (PWM) signal with a comparator 520. The comparator 520 receives the external variable 0~5V DC voltage and a triangular wave and determines the PWM signal, then outputs the PWM signal via a switch 590 to the fan-driving circuit (FDC) 510 in order to determine the rotation speed of the fan motor.

Figure 1B:
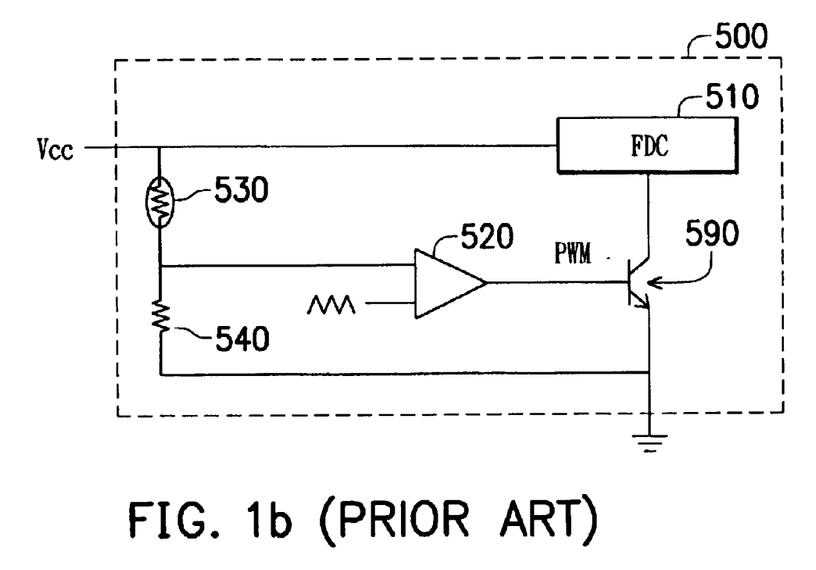
FIG. 1b is a schematic view showing a conventional fan control system controlled by a variable voltage determined by a temperature-sensitive resistor.

Another example of the conventional fan rotation speed control is shown in FIG. 1b, in which a temperature-sensitive resistor (or a thermistor) 530 is applied to determine the variable voltage. In FIG. 1b, the fan 500 receives an operating voltage Vcc, and determines a pulse width modulation (PWM) signal with a comparator 520. The comparator 520 receives a triangular wave and a variable voltage obtained from the operating voltage Vcc with a voltage dividing process performed by the temperature-sensitive resistor 530 and a fixed resistor 540. Thus, the comparator 520 determines the PWM signal, then outputs the PWM signal via a switch 590 to the fan-driving circuit (FDC) 510 in order to determine the rotation speed of the fan motor.

Figure 1C:
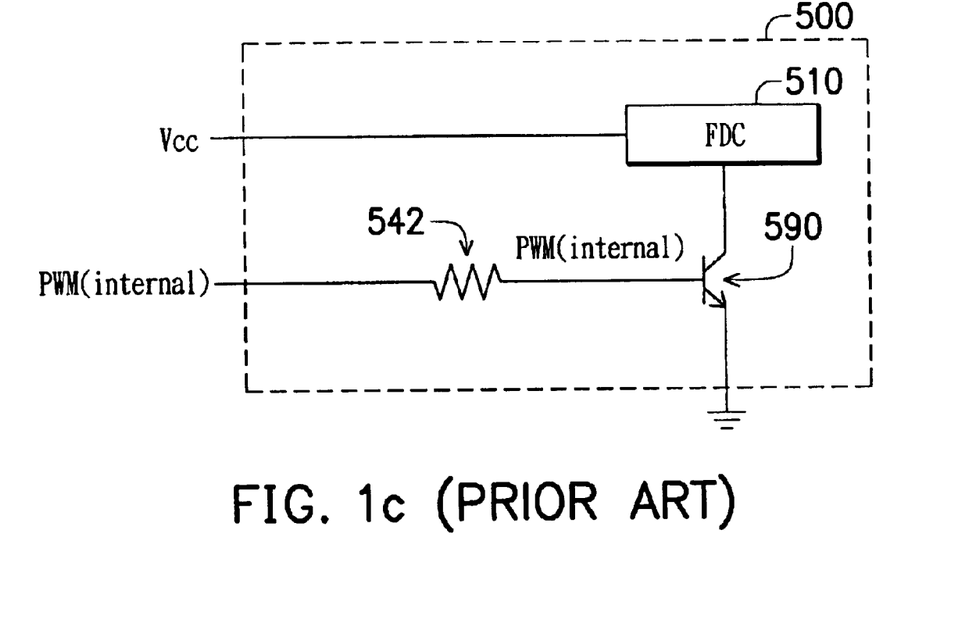
FIG. 1c is a schematic view showing a conventional fan control system controlled by an external PWM signal.

A further example of the conventional fan rotation speed control is shown in FIG. 1c, in which the input signal for controlling the fan 500 is an external PWM signal, shown as PWM(external) in FIG. 1c, instead of a voltage. In FIG. 1c, the fan 500 receives an operating voltage Vcc. Meanwhile, the external PWM signal PWM(external) passes through a certain circuit, such as a resistor 542, to be transformed to an internal PWM signal PWM(internal). The internal PWM signal is then output to the fan-driving circuit (FDC) 510 via a switch 590 in order to determine the rotation speed of the fan motor.

Figure 2A:
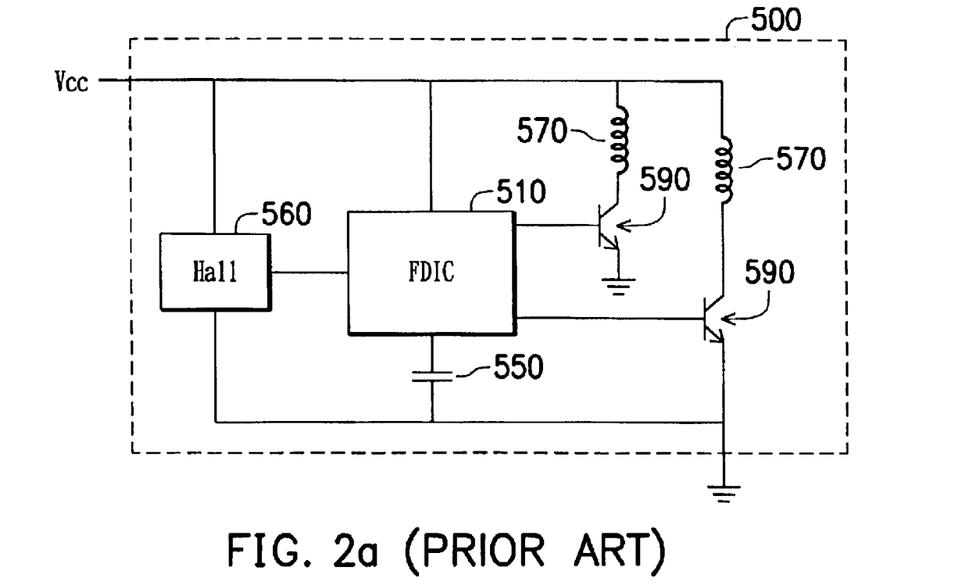
FIG. 2a is a schematic view showing a conventional fan control system, wherein the fan motor is driven by a fan-driving IC.

In addition to the fan rotation speed control, the conventional fan control system can achieve slow startup (soft startup) or any other specific rotation speed detection by position control of the fan motor rotor. An example of this is shown in FIG. 2a, in which the fan motor is driven by a fan-driving IC (FDIC) 510. In FIG. 2a, the fan 500 receives an operating voltage Vcc. Meanwhile, the FDIC 510 controls the coils 570 of the fan motor and incorporates with, the magnetic induction component such as a Hall element 560, and other components such as the capacitor 550 to control the rotor position of the fan motor, so that the required slow startup (soft startup) or any other specific rotation speed detection can be achieved.

Figure 2B:
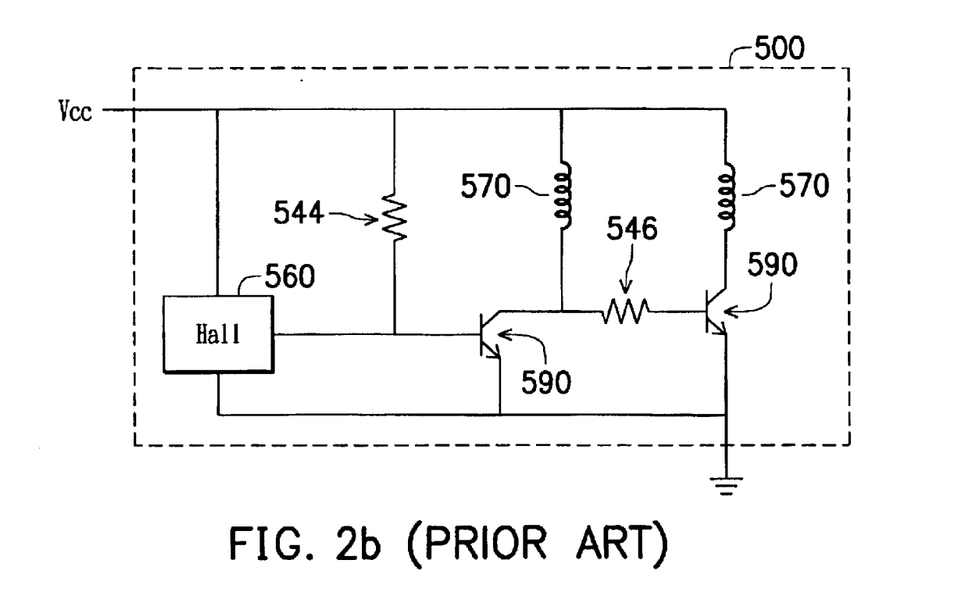
FIG. 2b is a schematic view showing a conventional fan control system, wherein the fan motor is driven by a Hall element.

FIG. 2b shows another method to achieve the above-mentioned rotor position control of the fan motor. In FIG. 2b, a Hall element 560 and a plurality of resistors 544, 546 are applied to control the coils 570 of the fan motor to drive the fan motor, so that the required slow startup (soft startup) or any other specific rotation speed detection can be achieved.

Figure 3:
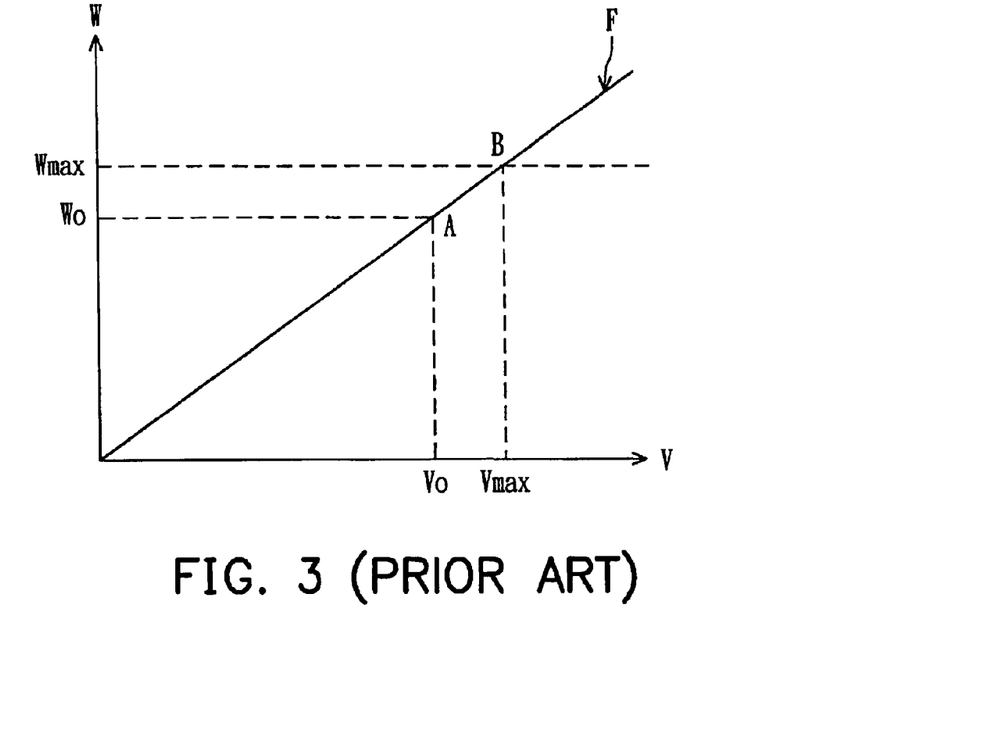
FIG. 3 is a diagram showing a relationship between the rotation speed and the input voltage in a conventional fan control system.

In the conventional fan control system for performing the fan rotation speed control, however, the input voltage and the coils of the fan motor determine the rotation speed of the fan motor. That is, a relationship between the rotation speed and the input voltage exists as shown in the diagram of FIG. 3 when the coils of the fan motor are fixed. In FIG. 3, this relationship is shown in a function F, corresponding to the fixed coils. If an input voltage Vo is applied, the function F determines the rotation speed according to the input voltage Vo at point A, in which a first rotation speed Wo is obtained. As a result, if the input voltage is kept constant, the only way to obtain a variable rotation speed is to provide several sets of coils of the fan motor, in which each set of coils corresponds to a different function F. This increases the size and manufacturing cost of the fan.

Further, in the conventional examples shown in FIG. 1a and FIG. 1b, the comparator 520 is applied to obtain the PWM signal. However, in these examples, the input voltage is generated by hardware-type components which are hard to be replaced, which increases the possibility of error between the PWM signals and the triangular wave signal, so that the rotation speed control is not stable.

Further, in the conventional example shown in FIG. 1c, the frequency and power of the internal PWM signal are limited to those of the external PWM signal. If the external PWM signal has a low frequency, the vibration due to the low frequency signal increases, a disadvantage to the fan properties and lifetime. On the other hand, if the external PWM signal has a high frequency, the circuit reaction time is relatively shortened, which can lead to unstable rotation speed. Further, in the transformation of the PWM signal, the frequency of the PWM signal can reach an audible frequency. In this case, annoying noise occurs in the fan motor.

Further, in the conventional examples shown in FIG. 2a or FIG. 2b, the fan control system is constructed by fixed hardware-type components with fixed properties. Thus, the position control of the fan motor rotor is restricted by the properties of the components.

As shown in FIG. 3, the relationship between the rotation speed and the operating voltage of the fan motor has a linear function (F). Further, the fan motor has a limitation of an endurable maximum rotation speed Wmax, as shown in FIG. 3. In the conventional fan control system, a maximum input voltage Vmax can be obtained according to the maximum rotation speed Wmax at point B. That is, the input voltage V is limited to the maximum input voltage Vmax in order to prevent overheating of the fan motor. Generally, a typical fan motor has a maximum input voltage Vmax of 60V. However, in a conventional fan control system, additional voltage transformers or voltage dividers are required if the power supply available for the input voltage exceeds this maximum input voltage Vmax. This not only increases the size and manufacturing cost of the fan control system, but also increases instability of the input voltage resulting from the voltage dividing process.

Further, the conventional fan control system can be modified to provide protection from overheating or exceeding allowable rotation speeds. In this case, however, additional components are required, which also leads to increased the size and manufacturing cost of the fan control system.

SUMMARY OF THE INVENTION

In view of this, the present invention discloses a fan control system, in which a microcontroller is applied in order to solve the conventional problems.

The present invention discloses a fan control system, which has a programmable microcontroller to receive an input signal, determining an output signal according to the input signal, and outputting the output signal; and a fan-driving unit to receive the output signal and adjust a rotation speed for driving the fan motor according to the output signal.

In the above-mentioned fan control system, the fan-driving unit can be a fan-driving circuit. Further, the input signal can be a variable voltage signal, an external pulse width modulation (PWM) signal, or a rotation speed signal obtained by detecting the actual rotation speed of the fan motor, and the output signal can be a PWM signal. Further, the microcontroller may be programmed to output an alarm when the rotation speed signal is different from a preset value stored in the microcontroller.

The present invention further discloses another form of a fan control system, in which a fan-driving microcontroller receives an input signal, determines an output signal according to the input signal, and adjusts a rotation speed for driving the fan motor according to the output signal.

In the above-mentioned fan control system, the input signal can be a variable voltage signal, an external pulse width modulation (PWM) signal, or a rotation speed signal obtained by detecting the actual rotation speed of the fan motor, and the output signal can be a PWM signal. Further, the microcontroller may be programmed to output an alarm when the rotation speed signal is different from a preset value. The above-mentioned fan control system may further have a magnetic induction component, such as a Hall element, for detecting the magnetic field phase of the fan motor in order to output the input signal to the fan-driving microcontroller.

The present invention further discloses another form of a fan control system, in which the fan motor is operated normally at not greater than a preset maximum rotation speed. The fan control system has a programmable microcontroller to receive an input voltage and a rotation speed signal obtained by detecting the actual rotation speed of the fan motor, determining an output signal according to the input voltage and the rotation speed signal, and outputting the output signal; and a fan-driving unit to receive the output signal and adjust the rotation speed for driving the fan motor according to the output signal. When the rotation speed is lower than a first rotation speed, the rotation speed is in a relation of a first function to the input voltage; when the rotation speed is greater than the first rotation speed, the rotation speed is in a relation of a second function to the input voltage; and a first maximum voltage corresponding to the maximum rotation speed in the relation of the first function is lower than a second maximum voltage corresponding to the maximum rotation speed in the relation of the second function.

In the above-mentioned fan control system, the fan-driving unit can be a fan-driving circuit, and the input signal can be a variable voltage signal. Further, the microcontroller may be programmed to output an alarm when the rotation speed signal exceeds a second rotation speed. It is preferable that the first function and the second function are linear functions, and the second function has a slope lower than that of the first function.

The present invention further discloses a further form of control, in which the fan motor is operated normally at not greater than a preset maximum rotation speed. The fan control system has a fan-driving microcontroller to receive an input voltage and a rotation speed signal obtained by detecting the actual rotation speed of the fan motor, adjusting a rotation speed according to the input voltage and the rotation speed signal for driving the fan motor according to the renewed rotation speed. When the rotation speed is lower than a first rotation speed, the rotation speed is in a relation of a first function to the input voltage; when the rotation speed is greater than the first rotation speed, the rotation speed is in a relation of a second function to the input voltage; and a first maximum voltage corresponding to the maximum rotation speed in the relation of the first function is lower than a second maximum voltage corresponding to the maximum rotation speed in the relation of the second function.

In the above-mentioned fan control system, the fan-driving unit can be a fan-driving circuit, and the input signal can be a variable voltage signal. Further, the microcontroller may be programmed to output an alarm when the rotation speed signal is different from a second rotation speed. It is preferable that the first function and the second function are linear functions, and the second function has a slope lower than that of the first function. The above-mentioned fan control system may further have a magnetic induction component, such as a Hall element, for detecting the magnetic field phase of the fan motor in order to output the input signal to the fan-driving microcontroller.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The present invention discloses a fan control system that uses a microcontroller instead of the conventional circuit components. The microcontroller is characterized by its programmable properties, and its functions achieved by the programs can be easily modified. Further, the microcontroller has a relatively small size and can receive or transform analog/digital (A/D) signals so that the present invention uses the microcontroller to solve the conventional problems.

The first preferred embodiment of the fan control system of the present invention is described with reference to FIG. 4. In the embodiment, the fan 100 receives an operating voltage Vcc, and the fan motor is driven by a fan-driving unit, such as the fan-driving circuit (FDC) 110 in FIG. 4, which are similar to the conventional fan control system. However, the present invention uses a microcontroller MICC 120 instead of the conventional circuit components. The microcontroller 120 is programmable and stores a plurality of programs to perform functions of signal transmission equivalent to transformation functions of the conventional circuit components. The microcontroller 120 can be simply operated with a voltage (not shown). Meanwhile, the microcontroller 120 receives an input signal Sinput. The input signal Sinput can be any form of signal, such as a voltage, a PWM signal, a rotation speed signal, etc., determined by the programs in the microcontroller 120.

Figure 4:
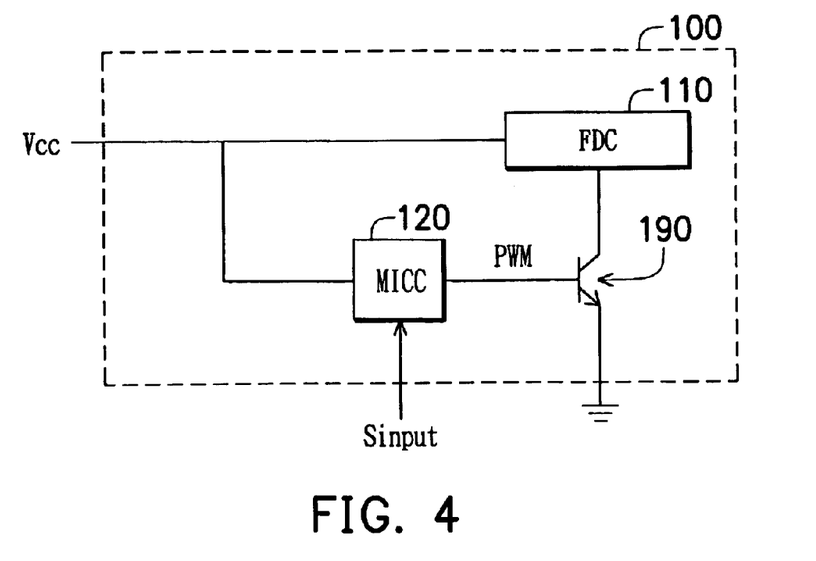
FIG. 4 is a schematic view showing the first embodiment of the fan control system of the present invention.

When the microcontroller 120 receives the input signal Sinput as shown in FIG. 4, an output signal, such as a PWM signal, is determined according to the input signal Sinput. The PWM signal is then output to the FDC 110 via the switch 190 so that the FDC 110 determines the rotation speed of the fan motor according to the PWM signal for the rotation speed control.

As mentioned above, the input signal Sinput in the present invention can be any form of signal in order to achieve the required function. Embodiments of the present invention that correspond to the conventional examples of FIG. 1a, FIG. 1b and FIG. 1c can be described in detail with reference to FIG. 5a, FIG. 5b and FIG. 5c.

Figure 5A:
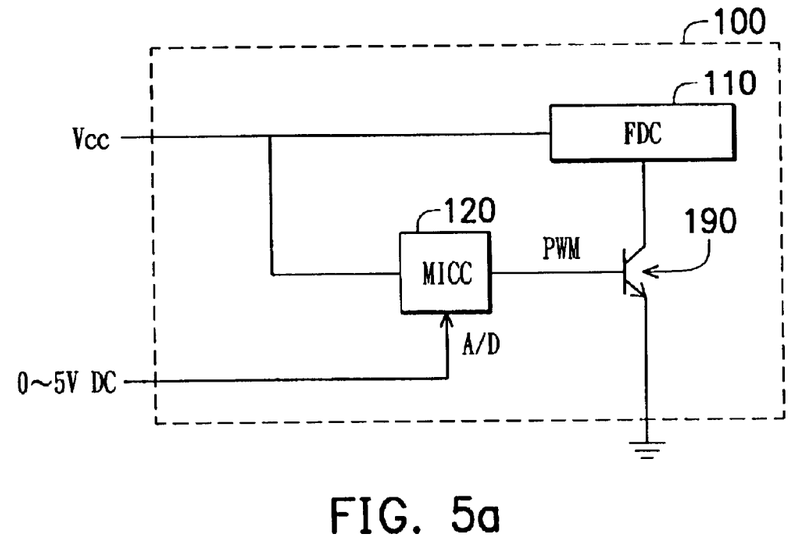
FIG. 5a is a schematic view showing the second embodiment of the fan control system of the present invention.

FIG. 5a shows the second preferred embodiment of the fan control system of the present invention corresponding to the conventional example of FIG. 1a. In FIG. 5a, the fan 100 receives an operating voltage Vcc, and determines a PWM signal with the microcontroller 120 instead of the comparator 520 in FIG. 1a. The microcontroller 120 receives the external variable 0~5V DC voltage, and transforms the voltage with the A/D transforming function programmed by the microcontroller 120 to determine the PWM signal, then outputs the PWM signal via the switch 190 to the FDC 110 in order to determine the rotation speed of the fan motor. Thus, the triangular wave in the conventional fan control system is not required, and the performance of the microcontroller 120 is definitely more stable than that of the conventional comparator 520.

Figure 5B:
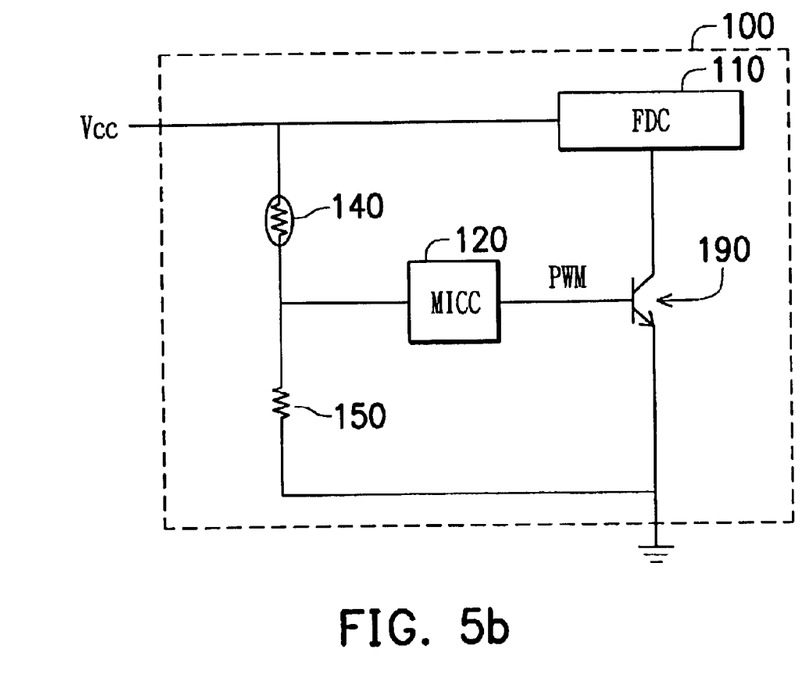
FIG. 5b is a schematic view showing the third embodiment of the fan control system of the present invention.

FIG. 5b shows the third embodiment of the fan control system of the present invention corresponding to the conventional example of FIG. 1b. In FIG. 5b, the fan 100 receives an operating voltage Vcc, and determines a PWM signal with the microcontroller 120 instead of the comparator 520 in FIG. 1b. The microcontroller 120 receives the variable voltage obtained from the operating voltage Vcc with a voltage dividing process performed by the temperature-sensitive resistor 140 and a fixed resistor 150, and transforms the voltage with the A/D transforming function programmed by the microcontroller 120 to determine the PWM signal, then outputs the PWM signal via the switch 190 to the FDC 110 in order to determine the rotation speed of the fan motor, similar to the embodiment shown in FIG. 5a.

Figure 5C:
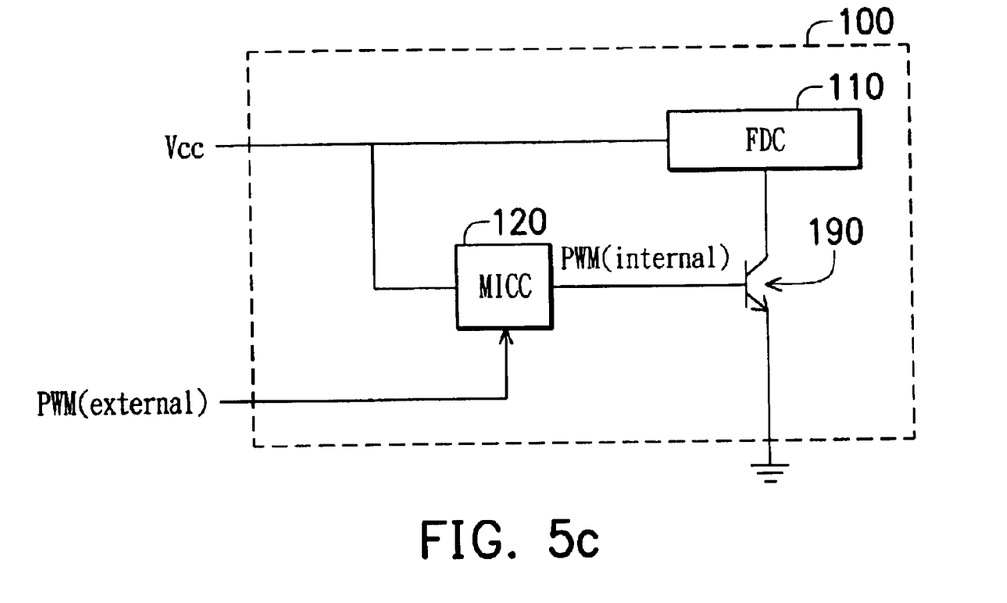
FIG. 5c is a schematic view showing the fourth embodiment of the fan control system of the present invention.

Further, similar to FIG. 1c, the fan 100 in the present invention can be controlled by inputting an external PWM signal, shown as PWM(external) in FIG. 5c, instead of a voltage. In FIG. 5c, the fan 100 receives an operating voltage Vcc. Meanwhile, the external PWM signal PWM (external) passes through the microcontroller 120 to be transformed to an internal PWM signal PWM(internal) with the modulation function programmed by the microcontroller 120. The internal PWM signal is then output to the FDC 110 via a switch 190 in order to determine the rotation speed of the fan motor. With the microcontroller 120 of the present invention, the signal transformation can be more accurate than the conventional circuit, such as the resistor in FIG. 1c.

Figure 6:
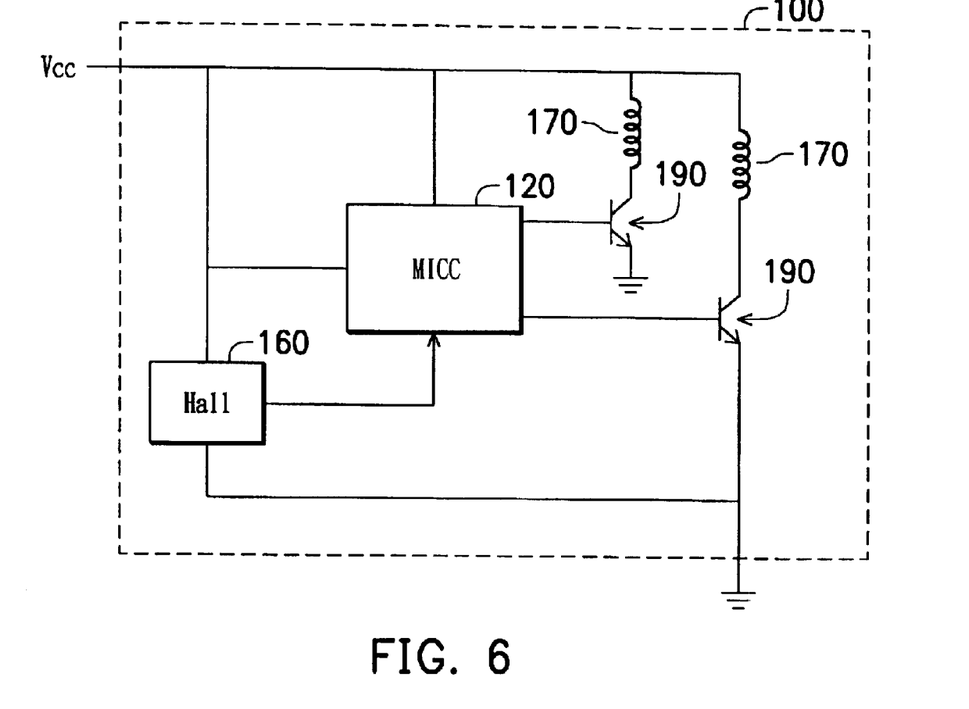
FIG. 6 is a schematic view showing the fifth embodiment of the fan control system of the present invention.

Further, in addition to the fan rotation speed control, the fan control system of the present invention can achieve slow startup (soft startup) or any other specific rotation speed detection by rotor position control of the fan motor. FIG. 6 shows another embodiment of the present invention corresponding to the conventional examples of FIG. 2a and FIG. 2b. In FIG. 6, the fan 100 receives an operating voltage Vcc. Meanwhile, the microcontroller 120 is applied instead of the conventional FDIC 510 in FIG. 2a to control the coils 170 of the fan motor and incorporates with the magnetic induction component such as a Hall element 160 to control the rotor position of the fan motor, so that the required slow startup (soft startup) or any other specific rotation speed detection can be achieved.

It should be noted that, since the microcontroller 120 is programmable to allow more than one program to be stored therein and can receive other external signals such as variable signals or PWM signals, it is possible for the microcontroller 120 to simultaneously provide multi-functions as described herein. Thus, the components of the fan control system may be further reduced with the microcontroller 120 performing multi-functions of fan motor control.

Figure 7:
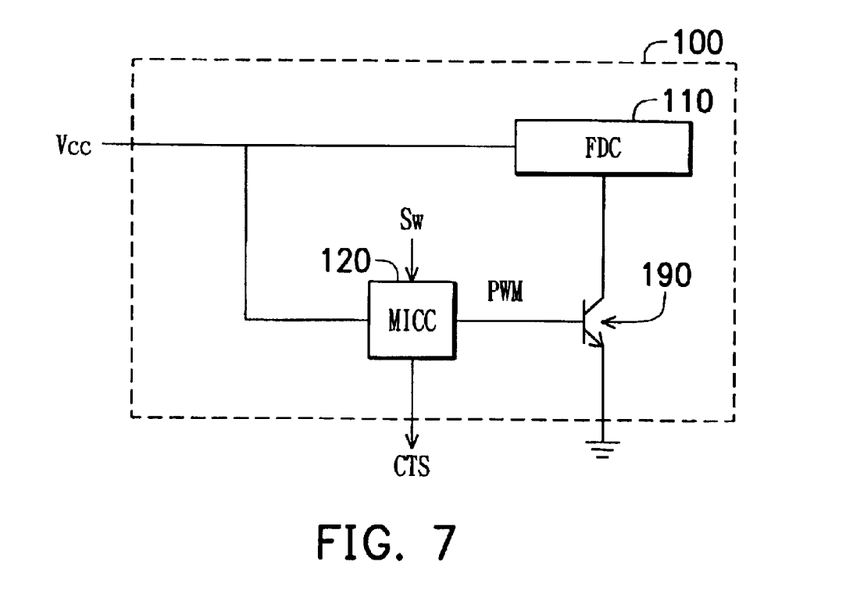
FIG. 7 is a schematic view showing the sixth embodiment of the fan control system of the present invention.

Further, the microcontroller 120 can be applied to perform rotation speed detection by way of feedback control such that the rotation speed can be more stable. FIG. 7 shows a further embodiment of the present invention, in which the microcontroller 120 receives a rotation speed signal Sw representative of the rotation speed of the fan motor as the input signal. The rotation speed signal Sw is then calculated and compared to determine the PWM signal output to the FDC 110. In this case, the microcontroller 120 can be programmed to output an alarm CTS when the rotation speed signal is different from a preset value (that is, a second rotation speed) stored in the program of the microcontroller 120, so that the rotation speed of the fan motor can be accurately controlled.

Figure 8:
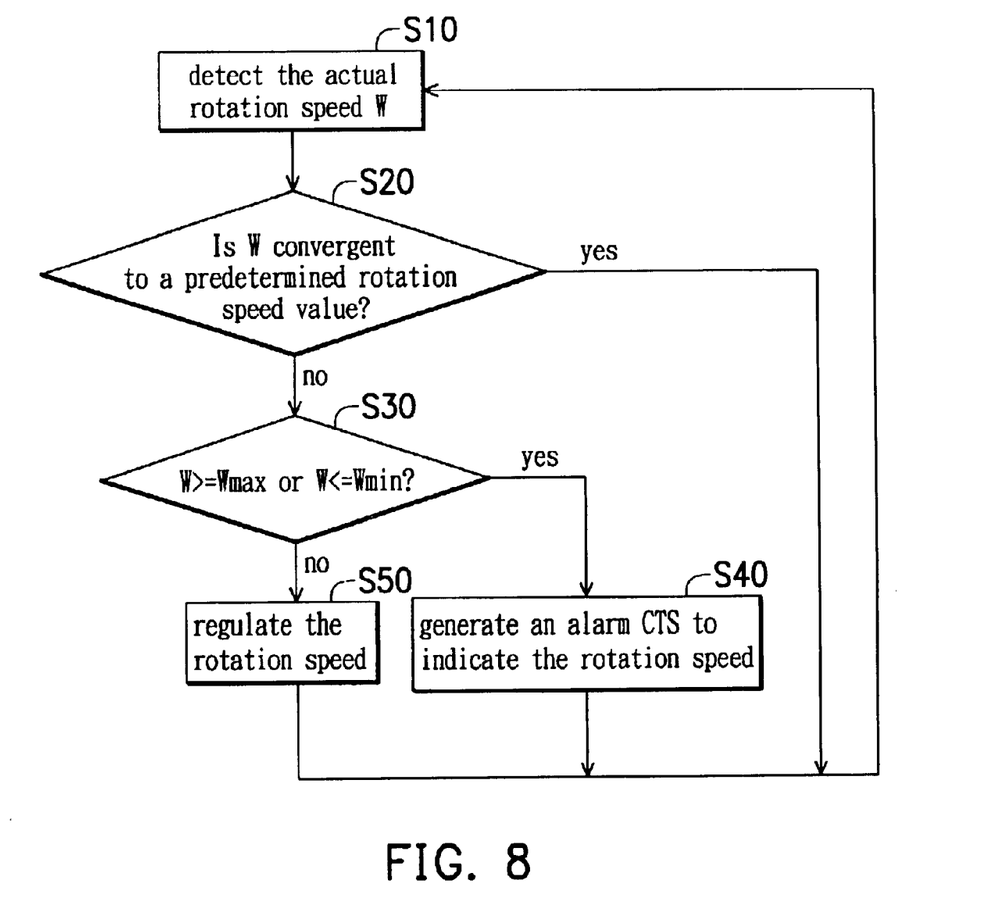
FIG. 8 is a flow chart showing the rotation speed of the fan motor controlled by the microcontroller of the present invention.

In the above-mentioned embodiment, an example of the rotation speed detection and control can be further described with reference to the flow chart of FIG. 8. First, the microcontroller 120 detects the actual rotation speed W of the fan motor (step S10). When the microcontroller 120 receives the actual rotation speed signal Sw, the microcontroller 120 recognizes if the rotation speed W is convergent to a predetermined rotation speed value (step S20). If the actual rotation speed W is not convergent, the microcontroller 120 recognizes if the rotation speed W reaches a maximum rotation speed Wmax or a minimum rotation speed Wmin (step S30). If the actual rotation speed W reaches any of the extreme values, it is possible that an error has occurred in the fan motor or the fan control system, so the microcontroller 120 generates an alarm CTS to indicate instablized rotation speed (step S40). If the actual rotation speed W does not reach any of the extreme values, the microcontroller 120 regulates the rotation speed (step S50). Thus, with the feedback control of the programmable microcontroller, the rotation speed can be accurately controlled in a shortened reaction time and a stable condition to the conventional fan control system.

Figure 9:
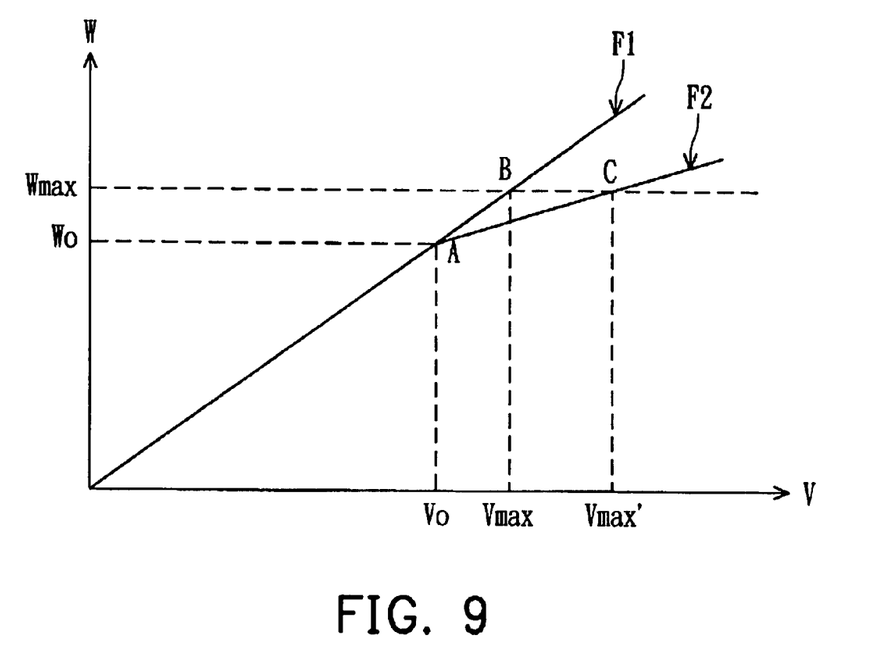
FIG. 9 is a diagram showing a relationship between the rotation speed and the input voltage in an embodiment of the fan control system of the present invention.

Further, since the fan motor has the limitation of a maximum rotation speed Wmax as mentioned above, a further embodiment of the fan control system of the present invention as shown in FIG. 9 can be applied to enable a higher input voltage. In FIG. 9, the microcontroller 120 can be programmed, so that when the rotation speed W is lower than a first rotation speed Wo, the rotation speed W is in a relation of a first function F1 to the input voltage V; when the rotation speed W is greater than the first rotation speed Wo, the rotation speed W is in a relation of a second function F2 to the input voltage V; and a first maximum voltage Vmax corresponding to the maximum rotation speed Wmax in the relation of the first function F1 is lower than a second maximum voltage Vmax' corresponding to the maximum rotation speed Wmax in the relation of the second function F2. It is preferable that the first function F1 and the second function F2 are linear functions, and the second function F2 has a slope lower than that of the first function F1, as shown in FIG. 9.

In this case, when the rotation speed W approaches the maximum rotation speed Wmax, the rotation speed W is in a relation of a second function F2 to the input voltage V. Since the second maximum voltage Vmax' corresponding to the maximum rotation speed Wmax in the relation of the second function F2 is larger than the first maximum voltage Vmax corresponding to the maximum rotation speed Wmax in the relation of the first function F1, the maximum input voltage can be increased from Vmax to Vmax'. For example, with the fan control system of the present invention, an input voltage of 80V~90V may be applied to a typical fan motor having a maximum input voltage Vmax of 60V. Thus, no additional voltage transformers or voltage dividers are required in the present invention, definitely preferable.

It should be noted that, since the microcontroller 120 is programmable and allows more than one program to be stored therein, the above-mentioned functions can be simultaneously applied to the microcontroller used in any of the embodiments of the present invention.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fan control system, comprising:
    a programmable microcontroller for receiving an input signal, determining an output signal according to the input signal, and outputting the output signal; and
    a fan-driving unit for receiving the output signal and adjusting a rotation speed for driving the fan motor according to the output signal;
    when the rotation speed is lower than a predetermined rotation speed, the rotation speed is in a relation of a first function to the input signal; and
    when the rotation speed is greater than the predetermined rotation speed, the rotation speed is in a relation of a second function to the input signal, wherein the first function and the second function are separate linear mathematical functions with different slopes.

2. The fan control system according to claim 1, wherein the input signal is a variable voltage signal.

3. The fan control system according to claim 1, wherein the input signal is an external pulse width modulation (PWM) signal.

4. The fan control system according to claim 1, wherein the input signal is a rotation speed signal obtained by detecting an actual rotation speed of the fan motor.

5. The fan control system according to claim 1, wherein the microcontroller outputs an alarm signal when the rotation speed signal is different from a preset value stored in a program of the microcontroller.

6. The fan control system according to claim 1, wherein the output signal is a pulse width modulation (PWM) signal.

7. A fan control system, comprising:
    a fan-driving microcontroller for receiving an input signal, determining an output signal according to the input signal, and adjusting a rotation speed for driving the fan according to the output signal;
    when the rotation soeed is lower than a predetermined rotation speed, the rotation speed is in a relation of a first function to the input signal; and
    when the rotation speed is greater than the first rotation speed, the rotation speed is in a relation of a second function to the input signal, wherein the first function and the second function are separate linear mathematical functions with different slopes.

8. The fan control system according to claim 7, wherein the input signal is a variable voltage signal.

9. The fan control system according to claim 7, wherein the input signal is an external pulse width modulation (PWM) signal.

10. The fan control system according to claim 7, wherein the input signal is a rotation speed signal obtained by detecting an actual rotation speed of the fan.

11. The fan control system according to claim 7, wherein the microcontroller outputs an alarm signal when the rotation speed signal is different from a preset value stored in the microcontroller.

12. The fan control system according to claim 7, further comprising a magnetic induction component for detecting a magnetic field phase of a motor for driving the fan in order to output the input signal to the fan-driving microcontroller.

13. The fan control system according to claim 12, wherein the magnetic induction component is a Hall element.

14. The fan control system according to claim 7, wherein the output signal is a pulse width modulation (PWM) signal.

15. A fan control system adapted to be used in a fan motor operated normally at not greater than a preset maximum rotation speed, the fan control system comprising:
    a programmable microcontroller for receiving an input voltage and a rotation speed signal corresponding to an actual rotation speed of the fan motor, determining an output signal according to the input voltage and the rotation speed signal, and outputting the output signal; and
    a fan-driving unit for receiving the output signal and adjusting the rotation speed for driving the fan motor according to the output signal;
    when the rotation speed is greater than the first rotation speed, the rotation speed is in a relation of a second function to the input voltage, wherein the first function and the second function are separate linear mathematical functions with different slopes; and a first maximum voltage corresponding to the maximum rotation speed in the relation of the first function is lower than a second maximum voltage obtained from the maximum rotation speed in the relation of the second function.

16. The fan control system according to claim 15, wherein the input signal is a variable voltage signal.

17. The fan control system according to claim 15, wherein the microcontroller outputs an alarm signal when the rotation speed signal exceeds a second rotation speed.

18. The fan control system according to claim 15, wherein the first function is a linear mathematical function.

19. The fan control system according to claim 15, wherein the first function and the second function are separate linear mathematical functions with different slopes, and the slope of the second function is smaller than that of the first function.

20. The fan control system according to claim 15, wherein the output signal is a pulse width modulation (PWM) signal.

21. A fan control system adapted to be used in a fan motor operated normally at not greater than a preset maximum rotation speed, the fan control system comprising:

a fan-driving microcontroller for receiving an input voltage and a rotation speed signal corresponding to an actual rotation speed of the fan motor and adjusting the rotation speed according to the input voltage and the rotation speed signal for driving the fan motor;

when the rotation speed is lower than a predetermined first rotation speed, the rotation speed is in a relation of a first function to the input voltage;

when the rotation speed is greater than the first rotation speed, the rotation speed is in a relation of a second function to the input voltage, wherein the first function and the second function are separate linear mathematical functions with different slopes; and a first maximum voltage corresponding to the maximum rotation speed in the relation of the first function is lower than a second maximum voltage obtained from the maximum rotation speed in the relation of the second function.

22. The fan control system according to claim 21, wherein the input signal is a variable voltage signal.

23. The fan control system according to claim 21, wherein the microcontroller outputs an alarm signal when the rotation speed signal is different from a second rotation speed.

24. The fan control system according to claim 21, wherein the first function is a linear mathematical function.

25. The fan control system according to claim 21, wherein the first function and the second function are separate linear mathematical functions with different slopes, and the slope of the second function is smaller than that of the first function.

26. The fan control system according to claim 21, further comprising a magnetic induction component for detecting a magnetic field phase of the fan motor in order to output the input signal to the fan-driving microcontroller.

27. The fan control system according to claim 26, wherein the magnetic induction component is a Hall element.

* * * * *